United States Patent [19]

Yokomizo

[11] Patent Number: 4,716,471
[45] Date of Patent: Dec. 29, 1987

[54] DATA DECODING APPARATUS

[75] Inventor: Yoshikazu Yokomizo, Kawagoe, Japan

[73] Assignee: Canon Kabushiki Kaisha, Tokyo, Japan

[21] Appl. No.: 18,868

[22] Filed: Feb. 25, 1987

Related U.S. Application Data

[63] Continuation of Ser. No. 581,436, Feb. 17, 1984, abandoned.

[30] Foreign Application Priority Data

Feb. 25, 1983 [JP] Japan ................................. 58-31172
Feb. 25, 1983 [JP] Japan ................................. 58-31173
Feb. 25, 1983 [JP] Japan ................................. 58-31174

[51] Int. Cl.⁴ .................... H04N 1/21; H04N 1/23; H04N 1/40; H04N 1/419
[52] U.S. Cl. .................................. 358/296; 358/261; 358/263
[58] Field of Search ............... 358/261, 263, 264, 265, 358/296

[56] References Cited

U.S. PATENT DOCUMENTS

| | | | |
|---|---|---|---|
| 4,013,827 | 3/1977 | Starck et al. | 358/263 |
| 4,146,909 | 3/1979 | Beckenhauer et al. | 358/261 X |
| 4,297,727 | 10/1981 | Ogawa et al. | 358/261 |
| 4,376,933 | 3/1983 | Saran et al. | 358/261 X |
| 4,399,467 | 8/1983 | Subramian | 358/261 |
| 4,441,208 | 4/1984 | Iida | 358/261 X |
| 4,494,151 | 1/1985 | Liao | 358/261 |
| 4,591,829 | 5/1986 | Takeda | 340/347 DD |

FOREIGN PATENT DOCUMENTS

1328061 8/1973 United Kingdom .
1338731 11/1973 United Kingdom .
1508653 4/1978 United Kingdom .
1580570 12/1980 United Kingdom .

Primary Examiner—E. A. Goldberg
Assistant Examiner—Patrick W. Foster
Attorney, Agent, or Firm—Fitzpatrick, Cella, Harper & Scinto

[57] ABSTRACT

A data decoding apparatus decodes MH codes having different code lengths in real time and at high speed. The apparatus has an image memory, a tristate buffer group, a parallel to serial converter, code length and run length decode ROMs, and a PAL group if desired. The tristate buffer from which the next code is to be read out can be selected immediately after decoding a given code in accordance with the code length of the given code. The PAL group is used to detect an end of line if an error occurs in a given line. The error can be eliminated with one line.

40 Claims, 2 Drawing Figures

DATA DECODING APPARATUS

This application is a continuation of application Ser. No. 581,436 filed Feb. 17, 1984, now abandoned.

BACKGROUND OF THE INVENTION

1. Field of the Invention

The present invention relates to a data decoding apparatus for use in an image file or a facsimile system. The apparatus of the invention is particularly suitable for high-speed decoding of image signals which are run-length-coded by the modified Huffman encoding method (one-dimensional compression) and stored or transmitted.

2. Description of the Prior Art

In conventional apparatuses of this type, when the data effective code lengths vary as in MH codes, processing speed for decoding cannot be kept constant. When printing is to be performed in accordance with decoded signals, a printer is required which is capable of changing the subscanning speed, which is often the paper feed speed. When decoded signals are supplied to a high-speed electrostatic printer which has a predetermined subscanning speed, the decoded signals are first stored in a one-page memory and are then supplied to the printer. Furthermore, since decoding is performed by software processing using a microprocessor, high-speed processing speed cannot be performed.

As mentioned above, since the code lengths vary, after decoding of a code is completed and the subsequent code is to be decoded, a code shift operation time for fetching this subsequent code in the decoding apparatus also varies, causing waiting time in signal processing.

When a decoding error is caused due to a bit drop of a code or the like, color inversion of a monochromatic image can be caused.

When the apparatus is designed for processing with the code having a maximum length, the number of signal lines or the capacity of the memory element and the like must be increased, resulting in higher cost and other disadvantages.

SUMMARY OF THE INVENTION

The present invention has been made in consideration of this and has for its object to provide a data decoding apparatus which can decode compressed codes at high speed and without error and which has a simple configuration.

It is another object of the present invention to provide a data decoding apparatus which is capable of high speed decoding (decoding of a code in, for example, several nanoseconds).

It is still another object of the present invention to provide a data decoding apparatus in which a signal processing circuit comprises hardware capable of high speed processing.

It is still another object of the present invention to provide a data decoding apparatus which is capable of continuous decoding from one code to another without waiting time.

It is still another object of the present invention to provide a data decoding apparatus which is capable of correcting errors caused during decoding operation.

It is still another object of the present invention to provide a data decoding apparatus in which the number of signal lines, the capacity of the memory element and the like are minimized.

It is still another object of the present invention to provide a data decoding apparatus which can be directly connected to a high-speed printer which has a constant subscanning speed, so that the apparatus can decode the input coded signals in real time and does not require a one-page memory.

It is still another object of the present invention to provide a data decoding apparatus which is suitably adapted for image recording based on codes from an image file using an optical or magnetic disk.

It is still another object of the present invention to provide a data decoding apparatus which is suitably adapted for decoding data which is compressed by the MH encoding method.

These objects are fulfilled in part, according to the present invention, by a data decoding apparatus having a memory or the like in which are stored a plurality of codes of variable lengths to be decoded. A read means reads out a predetermined amount of data from the memory means on a parallel basis, the predetermined amount being less than the total amount stored in the memory. A decoding means is provided for decoding a code contained in data read out from the memory means, and a control means controls operation of the read means, identifying code stored in the memory means and causing the read means to read out in parallel data containing the identified code. A detecting means may also be provided for detecting the length of the decoded code. A plurality of discriminating means may be provided, for discriminating whether or not specific data are stored in any of a plurality of memory locations in the memory means.

In another aspect, these objects are attained by means of a decoding apparatus for decoding codes obtained by compression. The apparatus comprises means for inputting the code, which comprises plural binary signals, means for detecting the number of consecutive specific signals of the input code, and means for decoding the input code in accordance with the number of consecutive specific signals detected, and signals other than those consecutive signals.

In another aspect, the invention provides a data decoding apparatus for decoding codes obtained by compression, comprising means storing the codes, which are of variable length, memory means for storing a predetermined amount of data read out from the storage means, means for decoding the code contained in the data stored in the memory means, and means for controlling a read operation by which the data are read out from the storage means into the memory means, in accordance with the length of the decoded code.

The above and other objects and advantages of the present invention will become apparent from the following description taken in conjunction with the accompanying drawings.

DETAILED DESCRIPTION OF THE PREFERRED EMBODIMENT

The preferred embodiment of the present invention will now be described in detail with reference to the accompanying drawings.

Figure 1:
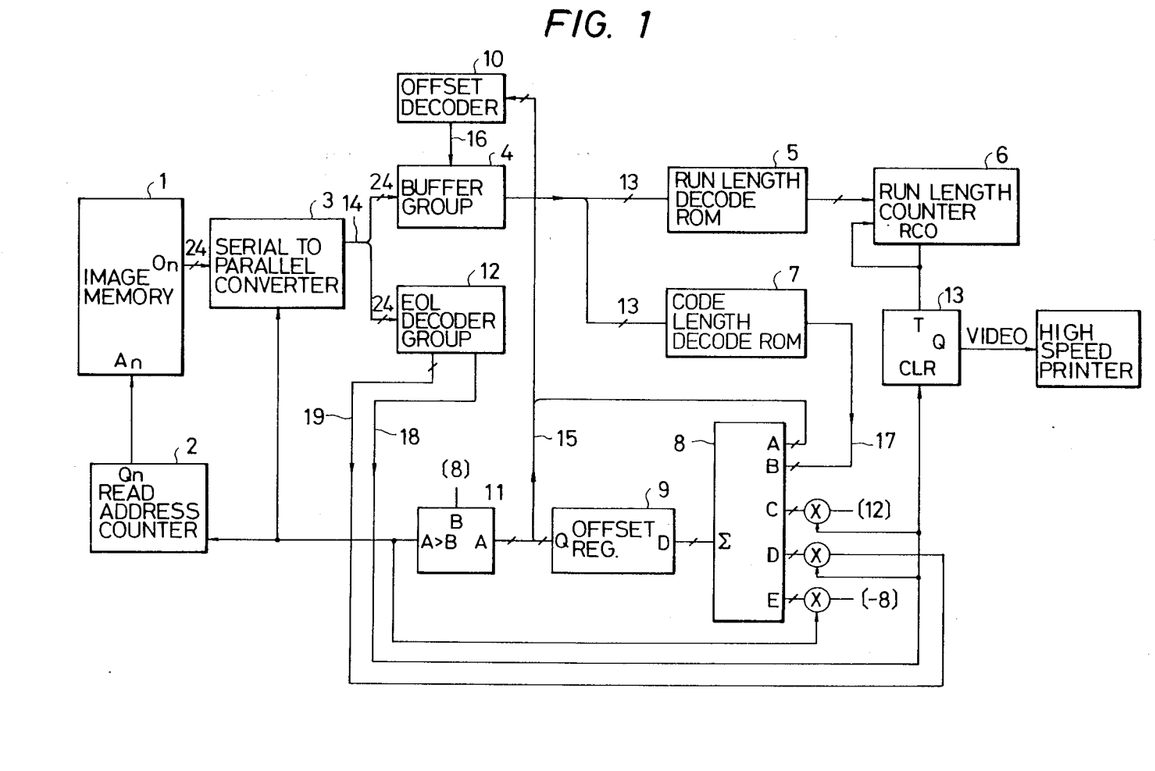
FIG. 1 is a block diagram showing the schematic configuration of a data decoding apparatus according to the present invention.

FIG. 1 is a block diagram showing the schematic configuration of a decoding apparatus adopting the MH method. An image memory 1 stores MH code image signals. The image memory 1 can be an image file memory having a capacity corresponding to at least one page such as an optical or magnetic disk. The image memory 1 can be a data memory for storing image signals transmitted from a remote location through signal lines. The MH code data is read out from the image memory 1 in units of 24 bits in a parallel manner or in another form. A read address counter 2 is a counter for supplying a read address for the image memory 1.

A parallel to serial converter 3 receives the 24-bit parallel data from the image memory 1 through an output data line On. The converter 3 divides the input 24-bit parallel data into three parallel data blocks and converts each parallel data block into serial data. The converter 3 includes a ternary counter 101 (FIG. 2) which increments by one the count of the read address counter 1 upon shifting the 8-bit parallel data blocks every three times. With this configuration, a time lag is eliminated which would be produced with a configuration including shift registers for sequentially converting the 24-bit data into 8-bit data.

Of the 24-bit data 14 output from the parallel to serial converter 3, a tristate buffer group 4 supplies a maximum of 13 continuous data starting with an offset value 15 (obtained from an offset register 9) to a run length decode ROM 5 and a code length decode ROM 7. The offset value 15 represents a position in data $D_0$ to $D_{23}$ parallel-shifted in units of 8 bits from which the MH code is to be extracted; a position at which the MH codes are segmented. The tristate buffer group 4 comprises a plurality of fourteen 13-bit tristate buffers which have input lines connected to the signal line 14 which are shifted from each other in units of bits and output lines which are wired OR. When a desired one of the tristate buffers is selected, corresponding data can be shifted. In other words, when one of the fourteen tristate buffers (each corresponding to one code) is enabled, a continuous code data (MH code) of 13 bits or less starting from a predetermined bit of the 24-bit input data can be instantaneously extracted. With this 8-bit parallel processing, MH codes having different effective code lengths can be easily extracted at high speed.

More specifically, if a given MH code consists of 3 bits, the subsequent MH code is stored in the tristate buffer three tristate buffers (bits) after the tristate buffer storing the given MH code. Then, this tristate buffer can be selected to allow instantaneous readout of the MH code without requiring a 3-bit shift operation. The MH code supplied to the run length decode ROM 5 is converted into run length data. The run length decode ROM 5 stores a conversion table for converting an MH code into a corresponding address and for producing a corresponding run length as output data.

The run length data from the ROM 5 is counted by the run length counter 6 which produces a black or white bit number.

A signal ripple carry out RCO representing an end of a counting operation of a run length counter 6 is supplied to itself to load the next run length data and is also supplied to and inverts a toggle flip-flop 13 which produces a signal representing whether the run length data received from the ROM 5 is black or white. In accordance with the output from the toggle flip-flop 13 and the output from the counter 6, a continuous video signal is obtained in which black bit groups and white bit groups alternately appear. The video signal from the flip-flop 13 is supplied to a high speed printer or the like. The code length decode ROM 7 stores a conversion table for converting, in a similar manner to that in the run length decode ROM 5, the MH code into an address and producing as output data the effective code length of the MH code contained in the 13-bit data selectively supplied from the tristate buffer group 4. A code length 17 from the code length decode ROM 7 is accumulated and added in the offset register 9 through an adder group 8. When all inputs C, D and E of the adder group 8 are "0", the original offset value 15 in the offset register 9 is supplied to an input A of the adder group 8. Since an updated code length 17 is supplied to an input B of the adder group 8, upon the supply of a clock pulse to the offset register, the updated offset value 15 is given by:

updated offset value = original offset value + code length

This updated offset value provides the start offset value of the MH code subsequent to the MH code currently decoded. When the selection of a tristate buffer in the tristate buffer group 4 is performed in accordance with this updated offset value, data starting immediately after the code length of the MH code currently being coded can be instantaneously read out and this next MH code can be discriminated. In this manner, boundaries of continuously supplied MH codes which have different code lengths can be easily discriminated and decoding of these MH codes can be performed easily.

Since the length of data which can be stored in the parallel to serial converter 3 is definite, supplementation must be performed. This means of supplementation will be described. When the offset value 15 exceeds 8, a comparator 11 detects this and shifts the parallel to serial converter 3 by 8-bits and sets new 8-bit data. Also, the comparator 11 also supplies "−8" to an input E of the adder group 8. Then, the updated offset value in this case is given by:

updated offset value = original offset value + code length − 8

Then, data is shifted by 8 bits and the offset value is similarly shifted. For this reason, the relative positions of the data set in the parallel to serial converter 3 and the offset value in the offset register 9 remain unchanged. The 8-bit shift is performed by the buffer, decoder and ternary counter as described above. Every time the count of the ternary counter reaches 2, three 8-bit shifts of the 24-bit data have been performed, and the next 24 bits of data are read out from the image memory 1. In this manner, the serial data 14 as viewed from the offset register 9 appears as data of an indefinite length with no boundaries between the MH codes.

Upon completion of decoding of a given MH code, the next MH code can be loaded simultaneously or immediately thereafter. For this reason, continuous MH code decoding can be performed at high speed without waiting time. For this reason, a printer or the like which operates intermittently and synchronously with the decoding operation is not required. An EOL (End of Line) code (a sync signal representing an end of one line) which is a special type of data in the MH code is decoded by a separate special decoder. This special decoder is an EOL decoder group 12 which receives the 24-bit data from the parallel to serial converter 3 in parallel with the tristate buffer group 4. The EOL decoder group 12 comprises fourteen 13-bit input PALs (Programable Array Logics). The EOL decoder group 12 decodes the serial data which is shifted in units of bits. When one of the PALs detects the EOL code, a 13-input OR gate produces an EOL signal 18. At the same time, an offset value 19 corresponding to the detected EOL code is produced. When one of the PALs of the EOL decoder group 12 decodes the EOL code, an EOL detection signal line 18 is set at H level to reset the toggle flip-flop 13 and to produce a white video signal for the next line input. At the same time, the line 18 serves to cause the adder group 8 to disregard the inputs A, B and E and to add the inputs C and D. At this time, the input C of the adder group 8 receives "12" as the code length of the EOL code, and the input D thereof receives the offset value 19 corresponding to the detected EOL code. As a result, the offset value 15 is updated as follows:

updated offset value=offset value of EOL decoder group+12

The EOL code is decoded by the special hardware for the following reason. If decoding generates an error due to a bit drop or the like, the resultant error (black and white inversion error or the like) must be (confined within the current line; this error must be prevented from being extended to the entire screen. The EOL code is decoded by the special hardware to correctly detect the end of each line to attain this. If there is no error in the decoding operation, in the outputs to the adder group 8, during the EOL code detection the input B representing the code length is equal to the input C, and the input D representing the offset value is equal to the sum of the inputs A and E.

In this manner, since the offset register is reset, the extracting start position of the MH code of the next line is correctly given by the EOL code. The EOL code can be given as a horizontal sync signal for the recording operation of the printer.

Figure 2:
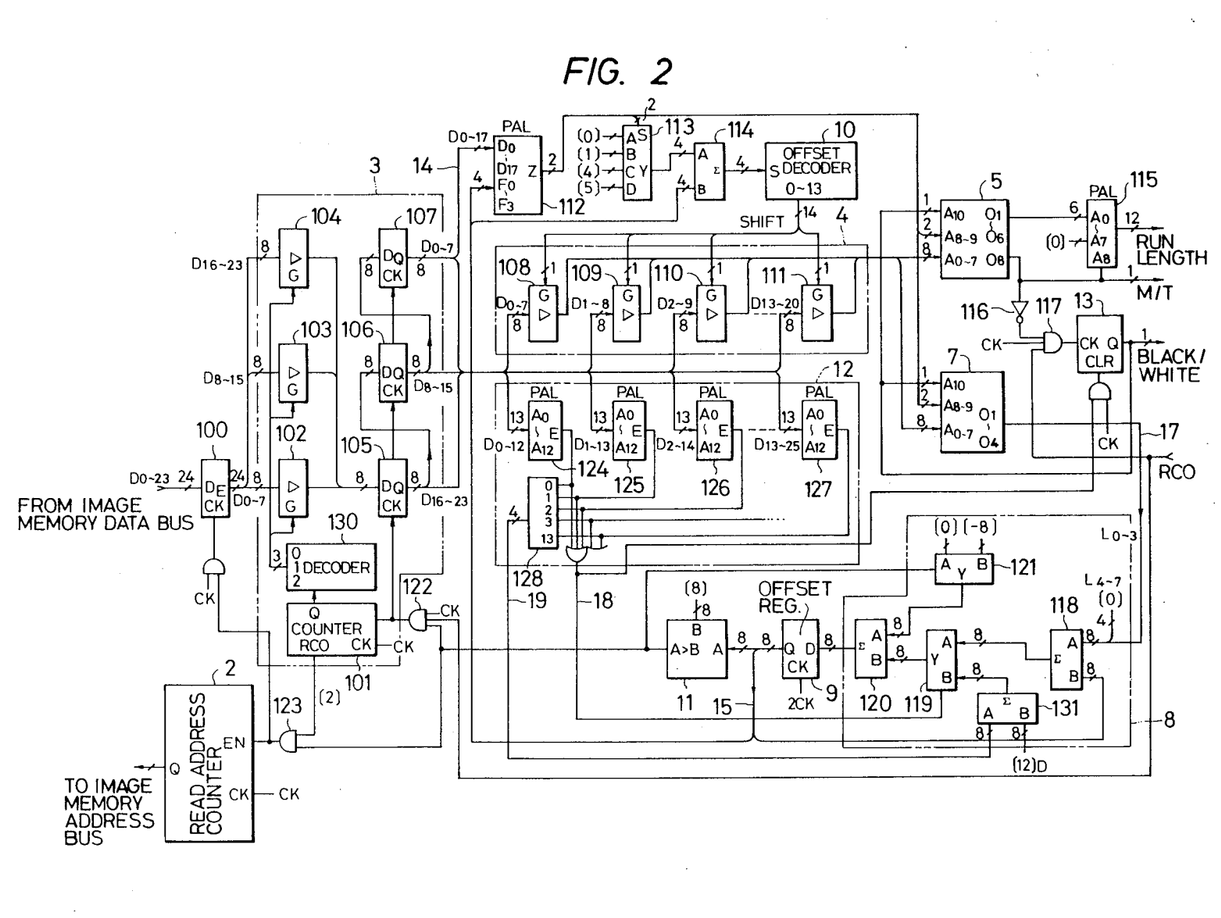
FIG. 2 is a block diagram showing the details of a circuit for realizing the decoding apparatus shown in FIG. 1.

The configuration and mode of operation of the respective blocks of the apparatus shown in FIG. 1 will now be described in detail with reference to FIG. 2. Referring to FIG. 2, a signal line mark (-/-) represents that the corresponding signal line consists of a plurality of signal lines and the attached number shows the number of such signal lines. The same reference numerals as in FIG. 1 denote the same parts in FIG. 2. A basic clock CK is supplied to some circuit elements of the apparatus. Parallel output (1-word 24-bit data $D_0$ to $D_{23}$ from the image memory (not shown) is latched in a D latch 100. The latching timing is when the ripple carry out of a ternary counter 101 is set at H level and the A>B output from the comparator 11 is set at H level. The latched data $D_0$ to $D_{23}$ is divided into continuous 8-bit data which are respectively wired-OR-input to a D latch 105 through tristate buffers 102, 103 and 104. One of the tristate buffers 102 to 104 is selected by an output from a decoder 130, and the 8-bit data stored in the selected buffer is latched in the D latch 105. The 8-bit parallel data supplied to the D latches 105, 106 and 107 are parallel-to-serial converted in the form of the 8-bit parallel, byte serial. The 24-bit data from the parallel to serial converter 3 is supplied to the tristate buffer group 4, and 8-bit data which are shifted in units of bits are stored in bits $D_0$ to $D_7$, $D_1$ to $D_8$, $D_2$ to $D_9$, and so on, of tristate buffers 108, 109, 110, and so on. Of the outputs $D_0$ to $D_{23}$, one stored in a selected one of the tristate buffers 108 to 111 of the tristate buffer group 4 is selected to allow selection of 8-bit data starting from a desired bit. When the tristate buffer 110, for example, is selected the outputs $D_2$ to $D_9$ are supplied to the run length decode ROM 5 and the code length decode ROM 7. Since the maximum code length of the MH codes is 13, theoretically a tristate buffer group consisting of 13-bit tristate buffers is required. However, in the embodiment shown in FIG. 2, the initial signal, four or five fill bits (0's) of the MH code, are decoded by a separate circuit (this is based on the special characteristics of the MH codes). This allows decoding of MH codes with data of less than 8 bits, thus simplifying the circuit.

A PAL 112 decodes the initial consecutive fill bits "0"s of the MH code. PAL is a tradename of U.S.A. Monolithic Memories Inc. and stands for programable array logic. Two devices "PAL18L4", for example, are combined to program with the logic as shown in Table 1 below. If there is no "0" from the start address indicated by the offset value from the offset register 9, a zero bit discrimination output "0" is produced. If there is at least one "0", a zero bit discrimination output "1" is produced. If there are four "0"s, a zero bit discrimination output "2" is produced. If there are five "0"s, a zero bit discrimination output "3" is produced. The zero bit discrimination output is supplied to a data selector 113 and is supplied as an address selection data to the two ROMs 5 and 7. Based on the input zero bit discrimination signal, the data selector 113 selects one of "0", "1", "4", and "5" (each representing a consecutive number of zeros) and produces a binary number representing the selected number. The output from the data selector 113 is added to the offset value 15 by an adder 114, and the sum is supplied to an offset decoder 10. Accordingly, the buffer selected from those of the tristate buffer group 4 produces consecutive 8-bit data from a position shifted by the output form the data selector 113, that is, from the buffer one buffer to the right from the current buffer if there is one "0" in the MH code. When the output from the data selector 113 is "0", the MH code consists of less than 8 bits. In this case, addition by the adder 114 is not performed.

When the initial "0" or "0"s of the MH code are decoded by a separate circuit, the capacity of the tristate buffer group can be reduced, and the number of address lines of the decode ROM can also be reduced.

When the accumulation result of the code length upon the shift operation of the tristate buffer group 4 exceeds 8, the output from the offset register 9 exceeds 8. Accordingly, the comparator 11 discriminates this and renders the converter 3 operative. Then, the latches 105 to 107 are shifted by 8 bits. That is, the data in the latch 105 is shifted to the latch 106, the data in the latch 106 is shifted to the latch 107. This means that the data to the tristate buffer group 4 is shifted by 8 bits. The respective buffers and latches are bit-connected such that the bits 1 to 8 of the latch 107 are connected to the bits 1 to 8 of the buffer 108, and the bits 2 to 8 of the latch 107 and the bit 1 of the latch 106 are connected to the bits 1 to 8 of the buffer 109. For this reason, the data stored in the respective buffers in the tristate buffer group are also shifted by 8 bits. For example, the same 8-bit buffer data as stored in the 10th tristate buffer is stored in the second tristate buffer upon this shift operation.

The value written in the run length decode ROM 5 assigns the address line to the run length code and the data line to the run length data. Similarly, in the code length decode ROM 7, the address line is assigned to the run length code, and the data line is assigned to the code length data. Black/white signal inputs are supplied to A10 of the PALs, the zero bit discrimination signal is supplied to A8 and A9 thereof, and the MH code is supplied to A0 to A7 thereof. Table 2 shows an example of programs stored in the run length decode ROM 5 and the code length decode ROM 7.

Since the run length of the makeup code is an integer multiple of 64, values obtained by dividing the run length of the makeup code by 64 are written in the ROM 5 and are multiplied by 64 by a 6-bit shift circuit 115 to obtain the correct run length. In other words, the output from the ROM 5 is shifted to the upper bits by 6 bits, and "0" are set in the lower bits. In the case of a terminating code, the shift operation of the shift circuit 115 is not performed, and the input data is produced from the shift circuit 115 without any modification. An output O8 from the ROM 5 is provided as a makeup code/terminating code (run length of less than 63 bits) discrimination signal output M/T. When a makeup code is produced, the signal M/T is inverted by an inverter 116, and the inverted signal renders a gate 117 inoperative so that the toggle flip-flop 13 is not inverted. The toggle flip-flop 13 is cleared by a signal 18 presenting the EOL code and resets its output to "white". With this configuration, the capacity of the run length decode ROM 5 can be reduced to the minimum.

The code length produced from the code length decode ROM 7 is added to the offset value by an adder 118. The sum from the adder 118 is generally supplied to the offset register 9 through a data selector 119 whose side A is generally selected and an adder 120. A data selector 121 generally selects "0" and selects "−8" when the comparator 11 determines that the offset value is larger than 8. Then, the adder 120 subtracts the accumulated value by 8. At the same time, a gate 122 is opened, and the values of the latches 105, 106 and 107 are shifted by 8 bits, respectively.

When the ternary counter 101 is incremented by one and the ripple carry out is produced, the read address counter 2 is incremented by one. The Q output from the ternary counter 101 is supplied to a decoder 130 which selects one of the tristate buffers 102 to 104 to load the new 8-bit data in the D latch 105.

PALs 124 to 127 (only these are illustrated, but fourteen PALs are provided in EOL decoder group 12) decode the EOL code. The EOL can be decoded by programming the following logic using "PAL16L6".

$$E = /A0*/A1*/A2*/A3*/...$$

$$...*/A10*/A11*/A12$$

An encoder 128 discriminates which PAL has decoded the EOL code and produces a corresponding output.

When the EOL code is detected, the encoder 128 discriminates which PAL has decoded the EOL code, and causes an adder 131 to add "12" to the output from the encoder 128 so that the offset output jumps by the data length corresponding to the EOL code. The offset output is reset through the data selector 119 which is selecting the input B in response to the EOL signal 18.

As a countermeasure against a zero run length, a FI-FO buffer of about 2 words can be incorporated in the parallel to serial converter 3, or the operation clock of the decoder can be doubled.

According to the present invention, color image coded data of B (blue), G (green), and R (red) or Y (yellow), M (magenta) and C (cyan) from a memory or the like can also be decoded in accordance with the respective colors.

In the embodiment described above, tristate buffers of the tristate buffer group can be 13-bit tristate buffers, and the processing circuit for the MH codes exceeding 8 bits can be omitted. However, in this case, the number of address lines for the decode ROM is increased, and the required capacity of the ROM is also increased.

The number of tristate buffers of the tristate buffer group and that of the PALs of the EOL decoder group are not limited to 14.

A single ROM can serve as the run length decode ROM and the code length decode ROM.

The apparatus of the present invention can be applied not only to decoding of MH codes but also to other types of compressed data.

When the recording operation of a printer or the like is horizontally synchronized in accordance with the EOL code detection, recording of each line can be assured.

As described above, in accordance with a decoder of MH codes of the embodiment of the present invention, a single MH code can be decoded within a 1 system clock which is shorter than the MH code, so that high-speed MH code decoding can be realized. This allows a combination of an image file in which pixels are stored as compressed and a high-speed printer.

Even if the code length of the MH code is longer than the run length such as the white run lengths 1, 2 and 3 and the black run length 1, since the MH code can be decoded within a period of a single system clock, the decoding does not require any waiting time. A printer or the like which must be intermittently operated need not be used, and image reproduction based on MH codes can be realized.

In decoding MH codes, the MH code must be generally decoded referring to 13-bit signal line. However, in the embodiment described above, the code having consecutive zeros is divided and the divided fill bits are decoded separately, so that the main decoder need only look at the 8-bit signal line and so that an inexpensive conversion ROM can be used.

In the embodiment described above, an EOL detection circuit can be incorporated to perform processing including the EOL detection, so that an adverse effect of error data on the entire screen can be prevented.

Although the present invention has been described with reference to the particular embodiment thereof, the present invention is not limited thereto. Various other changes and modifications may be made within the spirit and scope of the present invention as defined in the appended claims.

TABLE 1

| Offset value | | | | Input data | | | | | | | | | | | | | | |
|---|---|---|---|---|---|---|---|---|---|---|---|---|---|---|---|---|---|---|
| $F_3$ | $F_2$ | $F_1$ | $F_0$ | $D_0$ | $D_1$ | $D_2$ | $D_3$ | $D_4$ | $D_5$ | $D_6$ | $D_7$ | $D_8$ | $D_9$ | $D_{10}$ | $D_{11}$ | $D_{12}$ | $D_{13}$ | |
| 0 | 0 | 0 | 0 | 1 | | | | | | | | | | | | | | |
| | | | | 0 | | | | | | | | | | | | | | |
| | | | | 0 | 0 | 0 | 0 | 1 | | | | | | | | | | |
| | | | | 0 | 0 | 0 | 0 | 0 | | | | | | | | | | |
| 0 | 0 | 0 | 1 | | 1 | | | | | | | | | | | | | |
| | | | | | 0 | | | | | | | | | | | | | |
| | | | | | 0 | 0 | 0 | 0 | 1 | | | | | | | | | |
| | | | | | 0 | 0 | 0 | 0 | 0 | | | | | | | | | |
| | | | | ≈ | ≈ | ≈ | ≈ | ≈ | ≈ | ≈ | ≈ | ≈ | ≈ | ≈ | ≈ | ≈ | ≈ | |
| 1 | 1 | 0 | 1 | | | | | | | | | | | | | | 1 | |
| | | | | | | | | | | | | | | | | | 0 | |
| | | | | | | | | | | | | | | | | | 0 | |
| | | | | | | | | | | | | | | | | | 0 | |

| Offset value | | | | Input data | | | | | | | | | | | Output |
|---|---|---|---|---|---|---|---|---|---|---|---|---|---|---|---|
| $F_3$ | $F_2$ | $F_1$ | $F_0$ | $D_{14}$ | $D_{15}$ | $D_{16}$ | $D_{17}$ | $D_{18}$ | $D_{19}$ | $D_{20}$ | $D_{21}$ | $D_{22}$ | $D_{23}$ | | |
| 0 | 0 | 0 | 0 | | | | | | | | | | | | 0 |
| | | | | | | | | | | | | | | | 1 |
| | | | | | | | | | | | | | | | 2 |
| | | | | | | | | | | | | | | | 3 |
| 0 | 0 | 0 | 1 | | | | | | | | | | | | 0 |
| | | | | | | | | | | | | | | | 1 |
| | | | | | | | | | | | | | | | 2 |
| | | | | | | | | | | | | | | | 3 |
| | | | | ≈ | ≈ | ≈ | ≈ | ≈ | ≈ | ≈ | ≈ | ≈ | ≈ | | |
| 1 | 1 | 0 | 1 | | | | | | | | | | | | 0 |
| | | | | | | | | | | | | | | | 1 |
| | | | | 0 | 0 | 0 | 1 | | | | | | | | 2 |
| | | | | 0 | 0 | 0 | 0 | | | | | | | | 3 |

TABLE 2

| Input | | | | | | | | | | | Output | | | |
|---|---|---|---|---|---|---|---|---|---|---|---|---|---|---|
| $A_{10}$ | $A_9$ | $A_8$ | $A_7$ | $A_6$ | $A_5$ | $A_4$ | $A_3$ | $A_2$ | $A_1$ | $A_0$ | Run length | M/T | Code length | |
| 0 | 0 | 1 | 0 | 1 | 1 | 0 | 1 | 0 | 1 | | 0 | 0 | 8 | |
| 0 | 0 | 1 | 0 | 0 | 1 | 1 | 1 | | | | 1 | 0 | 6 | |
| 0 | 0 | 1 | 1 | 1 | 1 | | | | | | 2 | 0 | 4 | |
| 0 | 0 | 0 | 1 | 0 | 0 | 0 | | | | | 3 | 0 | 4 | |
| 0 | 0 | 0 | 1 | 0 | 0 | 1 | | | | | 4 | 0 | 4 | |
| 0 | 0 | 0 | 1 | 1 | 0 | 0 | | | | | 5 | 0 | 4 | |
| ≈ | ≈ | ≈ | ≈ | ≈ | ≈ | ≈ | ≈ | ≈ | ≈ | ≈ | ≈ | ≈ | | |
| 0 | 1 | 1 | 1 | 0 | 0 | | | | | | 45 | 0 | 8 | |
| 0 | 1 | 1 | 1 | 0 | 1 | | | | | | 46 | 0 | 8 | |
| ≈ | ≈ | ≈ | ≈ | ≈ | ≈ | ≈ | ≈ | ≈ | ≈ | ≈ | ≈ | ≈ | | |
| 0 | 0 | 0 | 1 | 1 | 0 | 1 | 1 | | | | 1 | 1 | 5 | |
| 0 | 0 | 1 | 1 | 0 | 1 | 1 | 1 | | | | 3 | 1 | 6 | |
| 0 | 0 | 1 | 1 | 1 | 0 | 1 | 0 | 1 | 0 | 1 | 16 | 1 | 9 | |
| X | 1 | 1 | 0 | 0 | 0 | 0 | 0 | 0 | 0 | 1 | 0 | 1 | 12 | EOL |
| ≈ | ≈ | ≈ | ≈ | ≈ | ≈ | ≈ | ≈ | ≈ | ≈ | ≈ | ≈ | ≈ | | |
| X | 1 | 1 | 0 | 0 | 1 | 1 | 1 | 1 | 1 | | 40 | 1 | 12 | |
| ≈ | ≈ | ≈ | ≈ | ≈ | ≈ | ≈ | ≈ | ≈ | ≈ | ≈ | ≈ | ≈ | | |
| 1 | 1 | 0 | 1 | 1 | 0 | 1 | 1 | 1 | | | 0 | 0 | 10 | |
| 1 | 0 | 1 | 1 | 0 | | | | | | | 1 | 0 | 3 | |
| 1 | 0 | 0 | 1 | 1 | | | | | | | 2 | 0 | 2 | |
| 1 | 0 | 0 | 1 | 0 | | | | | | | 3 | 0 | 2 | |
| 1 | 0 | 1 | 1 | 1 | | | | | | | 4 | 0 | 3 | |
| 1 | 0 | 1 | 0 | 1 | 1 | | | | | | 5 | 0 | 4 | |
| ≈ | ≈ | ≈ | ≈ | ≈ | ≈ | ≈ | ≈ | ≈ | ≈ | ≈ | ≈ | ≈ | | |
| 1 | 1 | 1 | 1 | 1 | 0 | 0 | 1 | 0 | 0 | | 48 | 0 | 12 | |

What is claimed is:

1. A data decoding apparatus for decoding codes obtained by compression, comprising:
   memory means for storing a plurality of codes which are to be decoded and which are of variable length;
   read means for reading out a predetermined amount of data from said memory means on a parallel basis, said predetermined amount of data being less than the amount of data stored in said memory means;
   decoding means for decoding a code contained in data read out in parallel from said memory means; and
   control means for controlling operation of said read means, said control means identifying code stored in said memory means and causing said read means to read out in parallel data containing the identified code from said memory means.

2. An apparatus according to claim 1, wherein said read means reads out the predetermined amount of data from said memory means.

3. An apparatus according to claim 1, wherein said decoding means comprises storage means for storing decoded data, said storage means being addressed by the data read out from said memory means to output decoded data.

4. An apparatus according to claim 1, wherein said control means controls operation of said read means in accordance with length of a code decoded by said decoding means.

5. An apparatus according to claim 1, wherein said memory continuously stores the variable length codes without any boundary therebetween.

6. An apparatus according to claim 1, wherein the codes are obtained by compression of image data according to a modified Huffman encoding method.

7. An apparatus according to claim 1, further comprising detection means, separate from said decoding means, for detecting a sync code contained in data read out from said memory means.

8. A data decoding apparatus for decoding codes obtained by compression, comprising:
  memory means for continuously storing a plurality of codes which are to be decoded and which are of variable length;
  read means for reading out a predetermined amount of data from said memory means;
  decoding means for decoding a code contained in the predetermined amount of data read out from said memory means;
  detecting means for detecting a length of the code decoded by said decoding means; and
  control means for controlling operation of said read means so as to read out from said memory means the predetermined amount of data containing code subsequent to the code decoded by said decoding means, in accordance with the length of the code detected by said detecting means.

9. An apparatus according to claim 8, wherein said control means controls a read location of the predetermined amount of data read from said memory means by said read means.

10. An apparatus according to claim 8, wherein said read means is adapted to read out in parallel the predetermined amount of data from said memory means.

11. An apparatus according to claim 8, wherein said memory means comprises a plurality of storage sections each capable of storing a predetermined amount of data, and said control means selects one of said plurality of storage sections.

12. An apparatus according to claim 11, wherein said plurality of storage sections respectively store continuous data which are shifted in units of the predetermined amount.

13. An apparatus according to claim 8, wherein the codes are are obtained by compression in accordance with a modified Huffman encoding method.

14. An apparatus according to claim 8, wherein said memory means continuously stores the variable length codes without any boundary therebetween.

15. A data decoding apparatus for decoding codes obtained by compression, comprising:
  memory means for continuously storing a plurality of codes to be decoded;
  decoding means for decoding the codes stored in said memory means;
  a plurality of discriminating means for discriminating as to whether or not a specific data is stored in any one of a plurality of memory locations of said memory means; and
  control means for controlling the decoding operation of said decoding means in accordance with the discriminating result by said plurality of discriminating means.

16. An apparatus according to claim 15, wherein the specific code discriminated by said discriminating means is a sync signal of each line.

17. An apparatus according to claim 15, wherein said decoding means comprises storage means for storing decoded data, said storage means being addressed by the code read out from said storage means to output decoded data.

18. An apparatus according to claim 15, wherein said control means controls read out of code in accordance with the discrimination result by said discriminating means.

19. An apparatus according to claim 15, wherein the codes are obtained by compression in accordance with a modified Huffman encoding method.

20. An apparatus according to claim 15, wherein said control means is adapted to perform such a control that a predetermined amount data containing the codes to be decoded are read out in parallel from said memory means.

21. A data decoding apparatus for decoding codes obtained by compression, comprising:
  inputting means for inputting the code which is to be decoded and which comprises plural binary signals;
  detecting means for detecting the number of consecutive specific signals of the code input by said inputting means; and
  decoding means for decoding the code input by said inputting means in accordance with the number of consecutive specific signals detected by said detecting means and signals other than the consecutive specific signals of the code.

22. An apparatus according to claim 21, wherein said detecting means the number of specific signals at the beginning of the code.

23. An apparatus according to claim 21, wherein said decoding means comprises storage means for storing decoded data, said storage means being addressed by data representing the number of consecutive specific signals and the signals following the signals and the signals following the consecutive signals to output decoded data.

24. An apparatus according to claim 21, wherein the code to be decoded is obtained by compression in accordance with a modified Huffman encoding method, and the specific signal are "0" signals.

25. An apparatus according to claim 21, further comprising memory means for storing the code input from said input means, and wherein signals other than the consecutive specific signals of the code are read out from said memory means in accordance with the number of consecutive specific signals which is detected by said detecting means.

26. A data decoding apparatus for decoding codes obtained by compression, comprising:
  memory means for continuously storing the codes to be decoded, said codes each comprising plural bits;
  read means for reading out data stored in said memory means;
  decoding means for decoding the codes in accordance with the data read out from said memory means; and
  read control means for detecting the number of consecutive specific signals of the code, and for controlling a readout operation of said read means in accordance with a detected number of the consecutive specific signals so as to supply signals other than the consecutive specific signals of the code to said decoding means.

27. An apparatus according to claim 26, wherein said read means reads out a predetermined amount of continuous data from said memory means.

28. An apparatus according to claim 26, wherein said memory means has a plurality of storage sections each capable of storing the predetermined amount of data, and said control means selects one of said plurality of storage sections.

29. A data decoding apparatus for decoding codes obtained by compression, comprising;
 storage means for storing the codes which are to be decoded and which are of variable length;
 memory means for storing a predetermined amount of data read out from said storage means;
 decoding means for decoding the code contained in the data stored in said memory means; and
 control means for controlling a readout operation of the data from said storage means into said memory means, in accordance with a length of the code decoded by said decoding means.

30. An apparatus according to claim 29, wherein said control means is adapted to perform such a control that the predetermined amount of data is read out in parallel from said storage means.

31. An apparatus according to claim 29, wherein said control means counts a length of the code decoded by said decoding means and causes the readout operation of the data to be performed when the counted length of the code becomes a predetermined value.

32. An apparatus according to claim 29, wherein said memory means performs a shift operation upon every decoding operation of said decoding means.

33. A data decoding apparatus for decoding codes obtained by compression, comprising:
 inputting means for inputting data containing the codes to be decoded;
 memory means for storing the data input from said input means, and for outputting the data in parallel;
 decoding means for decoding the code contained in the data code output in parallel from said memory means and
 control means for performing such a control that the data containing code to be subsequently decoded is outputted from an arbitrary location of said memory means without a waiting time after completion of the decoding operation of said decoding means.

34. An apparatus according to claim 33, wherein said memory means continuously stores the codes to be decoded, and said memory means performs at a time a data shift by a code length of the code decoded after the decoding operation of said decoding means.

35. An apparatus according to claim 33, wherein said control means is operable to read out the code stored in any arbitrary location of said memory means in accordance with the length of the code decoded by said decoding means.

36. An apparatus according to claim 33, wherein the codes are obtained by compression in accordance with a modified Huffman encoding method.

37. An apparatus according to claim 33, wherein said decoding means storage means in which the decoded data are stored, said storage means being addressed by data outputted in parallel from said memory means to output the decoded data.

38. An apparatus according to claim 26, wherein said decoding means is operable to decode the code in accordance with the number of the consecutive specific signals of the code and signals other than the consecutive specific signals of the code.

39. An apparatus according to claim 26, wherein the codes are obtained by compression in accordance with a modified Huffman encoding method, and the specific signal is a "0" signal.

40. An apparatus according to claim 29, wherein said decoding means includes means for storing the decoded data therein said storing means is addressed by the code to produce the decoded data.

* * * * *

UNITED STATES PATENT AND TRADEMARK OFFICE
CERTIFICATE OF CORRECTION

PATENT NO. : 4,716,471
DATED : December 29, 1987
INVENTOR(S) : YOSHIKAZU YOKOMIZO It is certified that error appears in the above-identified patent and that said Letters Patent is hereby corrected as shown below:

Title page:

IN [56] REFERENCES CITED

U.S. PATENT DOCUMENTS, "Subramian" should read --Subramaniam--.

COLUMN 1

Line 52, "high" should read --high- --.
    Line 58, "high" should read --high- --.

COLUMN 4

Line 9, "high speed" should read --high-speed--.

COLUMN 5

Line 11, "(Programable" should read --(Programmable--.
    Line 34, "(confined" should read --confined--.
    Line 58, "$D_{23}$" should read --$D_{23}$)--.

COLUMN 6

Line 12, "selected" should read --selected,--.
    Line 18, "(O's)" should read --("O"s)--.
    Line 25, "programable" should read --programmable--.
    Line 46, "form" should read --from--.

UNITED STATES PATENT AND TRADEMARK OFFICE
CERTIFICATE OF CORRECTION

PATENT NO. : 4,716,471
DATED : December 29, 1987
INVENTOR(S) : YOSHIKAZU YOKOMIZO It is certified that error appears in the above-identified patent and that said Letters Patent is hereby corrected as shown below:

COLUMN 11

Line 8, "memory" should read --memory means--.
    Line 52, "are are" should read --are--.

COLUMN 12

Line 12, "read out" should read --read-out--.
    Line 20, "amount data" should read --amount of data--.
    Line 37, "means the" should read --means detects the--.
    Line 43, "signals following the signals and the signals following" should read --signal following--.
    Line 49, "specific signal" should read --specific signals--.

COLUMN 14

Line 4, "data code" should read --data--.
    Line 5, "means and" should read --means; and--.

UNITED STATES PATENT AND TRADEMARK OFFICE
CERTIFICATE OF CORRECTION

PATENT NO. : 4,716,471
DATED : December 29, 1987
INVENTOR(S) : YOSHIKAZU YOKOMIZO Page 3 of 3

It is certified that error appears in the above-identified patent and that said Letters Patent is hereby corrected as shown below:

COLUMN 14

Line 25, "means storage" should read --means comprises storage--.

Line 40, "therein said" should read --therein and said--.

Signed and Sealed this

Twenty-sixth Day of June, 1990

Attest:

HARRY F. MANBECK, JR.

*Attesting Officer*  *Commissioner of Patents and Trademarks*